(12) United States Patent
Wu et al.

(10) Patent No.: US 9,324,910 B2
(45) Date of Patent: Apr. 26, 2016

(54) LIGHT EMITTING DIODE

(71) Applicant: TSMC Solid State Lighting Ltd., Hsinchu (TW)

(72) Inventors: Hsin-Hsien Wu, Hsinchu (TW); Chyi Shyuan Chern, Taipei (TW); Chun-Lin Chang, Jhubei (TW); Ching-Wen Hsiao, Hsinchu (TW); Kuang-Huan Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/558,798

(22) Filed: Dec. 3, 2014

(65) Prior Publication Data

US 2015/0083998 A1    Mar. 26, 2015

Related U.S. Application Data

(62) Division of application No. 13/112,046, filed on May 20, 2011, now Pat. No. 8,906,712.

(51) Int. Cl.
| | |
|---|---|
| *H01L 29/06* | (2006.01) |
| *H01L 33/22* | (2010.01) |
| *H01L 21/265* | (2006.01) |
| *H01L 33/32* | (2010.01) |
| *H01L 33/00* | (2010.01) |
| *H01L 33/06* | (2010.01) |

(52) U.S. Cl.
CPC ............ *H01L 33/22* (2013.01); *H01L 21/2654* (2013.01); *H01L 21/26593* (2013.01); *H01L 33/0025* (2013.01); *H01L 33/06* (2013.01); *H01L 33/32* (2013.01); *H01L 21/26546* (2013.01)

(58) Field of Classification Search
CPC .......... H01L 33/22; H01L 33/32; H01L 33/06
USPC .......................................................... 257/13
See application file for complete search history.

(56) References Cited

U.S. PATENT DOCUMENTS 8,502,192 B2    8/2013    Kwak et al.

OTHER PUBLICATIONS

Kyoichi Suguro, Atsushi Murakoshi, Haruko Akutsu and Katsuya Okumura; "Cryo-Implantation Technology;" 4 Pages; Process & Manufacturing Eng. Center, Semiconductor Company, Toshiba Corporation; Japan.

I. Schnitzer, E. Yablonovitch, C. Caneau, T.J. Gmitter and A. Schrer; "30% External Quantum Efficiency From Surface Textured, Thin-Film Light-Emitting Diodes;" Oct. 18, 1993; pp. 2174-2176; Appl. Phys. Lett. 63 (16); American Institute of Physics.

*Primary Examiner* — Douglas Menz
(74) *Attorney, Agent, or Firm* — Muncy, Geissler, Olds & Lowe, P.C.

(57) ABSTRACT

A device includes: a substrate; and a doped III-V compound layer disposed over the substrate; wherein: the doped III-V compound layer includes an upper boundary; the upper boundary has a micro-roughened texture and a macro-roughened texture where the micro-roughened texture located on; and the upper boundary includes dopant ions that are not present in a remainder of the doped III-V compound layer underneath the upper boundary.

20 Claims, 5 Drawing Sheets

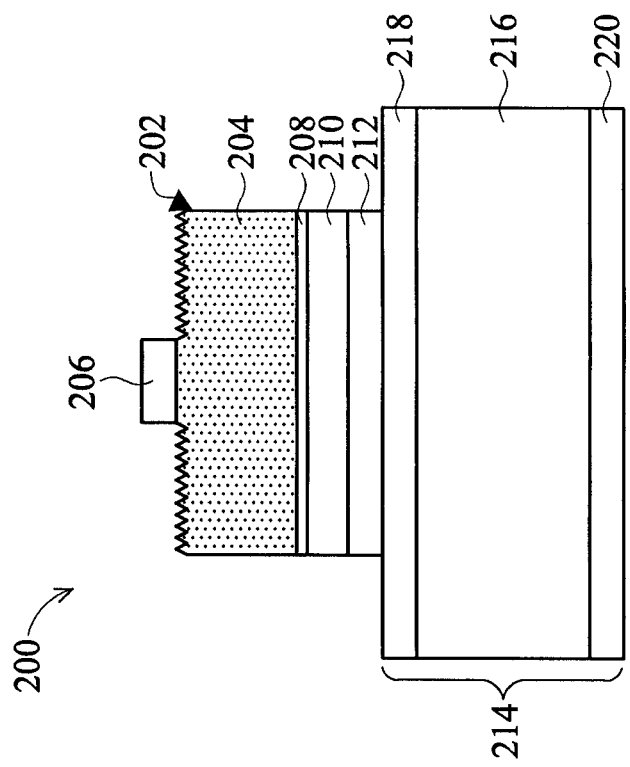
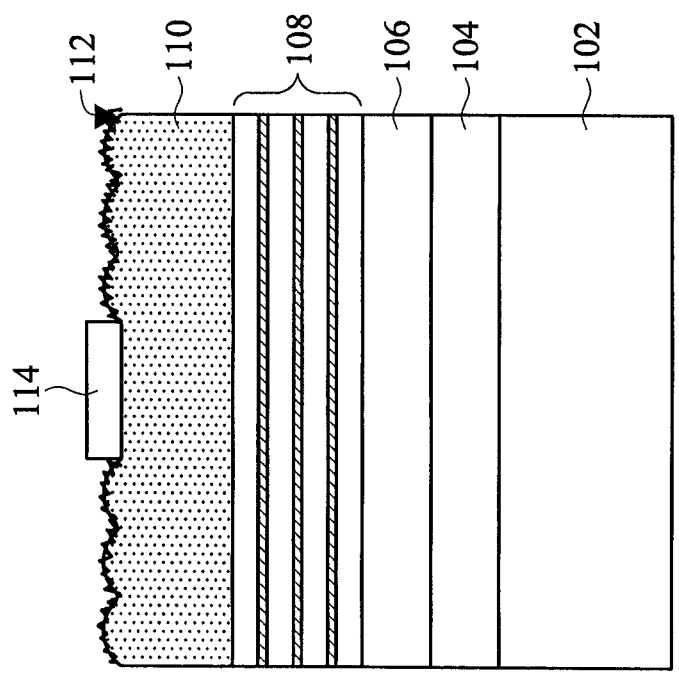
Fig. 1
Fig. 2

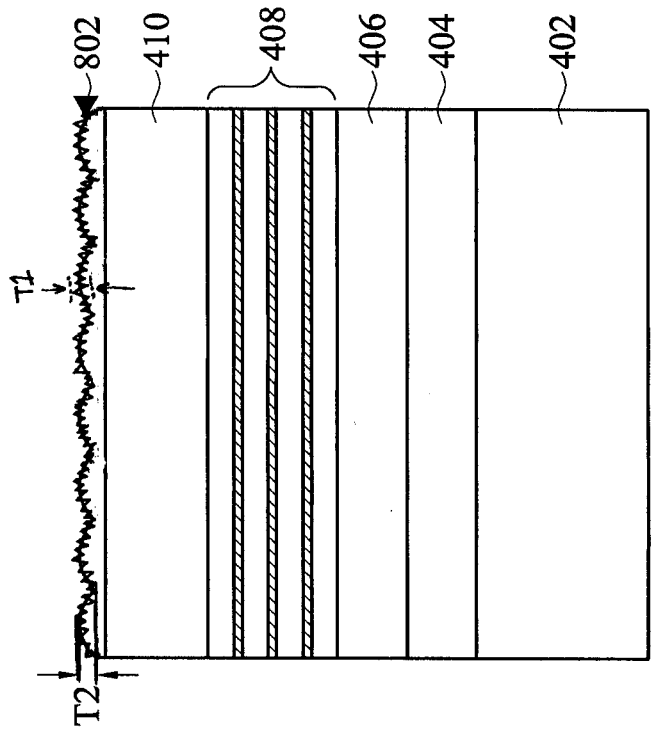
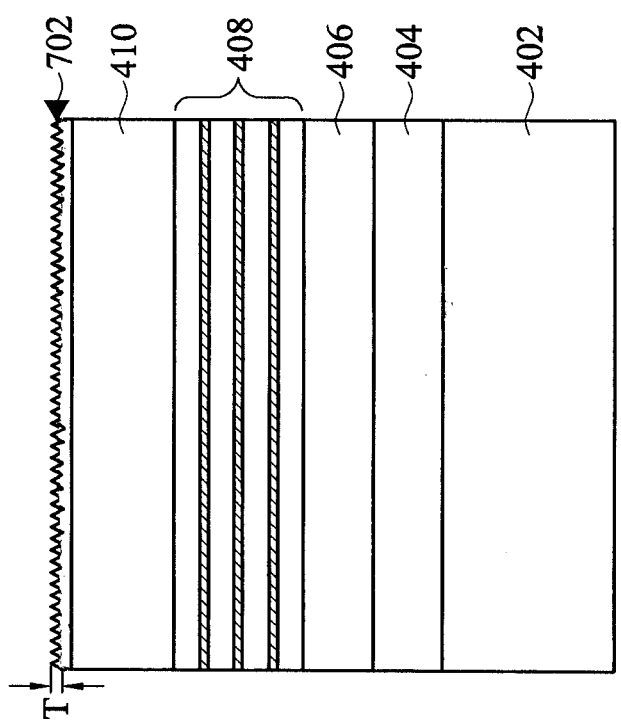
Fig. 8
Fig. 7

LIGHT EMITTING DIODE

PRIORITY DATA

The present application is a divisional of U.S. patent application Ser. No. 13/112,046, filed on May 20, 2011, now U.S. Pat. No. 8,906,712, issued Dec. 9, 2014, the disclosure of which is hereby incorporated by reference in its entirety.

BACKGROUND

The present disclosure relates to light-emitting diode (LED) semiconductor light sources, and fabrication thereof. LEDs are used in diverse lighting applications and can be used to provide radiation across the visible, ultraviolet and/or infrared wavelengths. Such applications include displays, printers, communications, and optoelectronic computer interconnects. One type of LED is a III-V group compound semiconductor LED element, for example, a GaN-LED. However, obtaining sufficient brightness from a GaN-LED, and LEDs in general, has been a challenge. Therefore, what is desired is an LED and process of fabrication of an LED that increases the maximum radiation (e.g., light) output or efficiency.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a cross-sectional view of an embodiment of a vertical structure GaN-LED including a surface according to aspects of the present disclosure.

FIG. 2 is a cross-sectional view of an alternative embodiment of a vertical structure GaN-LED including a surface according to aspects of the present disclosure.

FIGS. 4-8 illustrate cross sectional views of an embodiment of an LED corresponding to one or more of the steps of the method of FIG. 3.

DETAILED DESCRIPTION

Figure 4:
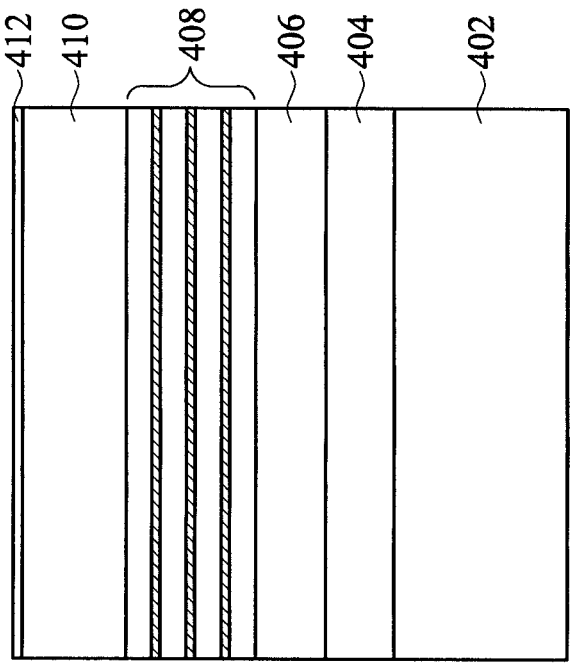

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Furthermore, to the extent the present disclosure illustrates embodiments of vertical structure GaN LEDs, one of ordinary skill in the art would recognize the benefits of the methods discussed herein as applied to other types of LEDs.

Illustrated in FIG. 1 is a light-emitting diode (LED) element 100. The LED element 100 is a vertical structure GaN-LED, however other configurations are possible. The LED element 100 may be a completed LED product, or portion thereof, or provided during one or more stages of fabrication. The LED element 100 includes a substrate 102. A plurality of layers (e.g., a stack) is disposed on the substrate 102. The layers include a GaN layer 104, a AlGaN layer 106, a multiple quantum well (MQW) layer 108, a GaN layer 110, and an electrode 114. The GaN layer 104 may be a p-type layer (p-GaN). The AlGaN layer 106 may be a p-type layer (e.g., having p-type conductivity) (p-AlGaN). The GaN layer 110 may be n-type (e.g., n-type conductivity) (n-GaN). The substrate 102 may include sapphire, oxide monocrystalline, SiC, silicon, ZnO, GaAs, $MgAl_2O_4$, and/or other suitable material. The substrate 102 may include further layers such as, for example, buffer layers, intermediate layers, reflective layers, and/or other suitable layers. The electrode 114 provides an ohmic contact layer and may include various electrically conductive materials. The electrode 114 may be an n-side electrode. Any one of the layers 104, 106, 108, and/or 110 may be epitaxially grown or formed by other suitable methods.

The LED element 100 has a treated surface 112. The treated surface 112 is disposed on and/or in the GaN layer 110. In an embodiment, the treated surface 112 includes the top surface region of a n-GaN layer. The treated surface 112 has a roughened surface property or texture. The treated surface 112 having improved roughness, provides for improved radiation (e.g., light) output by the LED element 100 as compared to a typically formed (e.g., native) flat or planar surface. The treated surface 112 may provide enhance radiation (e.g., light) extraction efficiency of the LED element 100 due to the scattering of photons from the textured surface 112. The treated surface 112, as illustrated in FIG. 1, includes micro-roughened texture and macro-roughened texture.

The treated surface 112 may be formed using one or more treatments described herein. These treatments are described in further detail with reference to step 304 of the method 300 illustrated in FIG. 3. For example, the treated surface 112 may be formed by performing an ion implantation process on a native surface of the GaN layer 110. The ion implantation process may provide a micro-roughening or texturing of the surface. In an embodiment, the ion implantation process is coupled with additional treatments such as, wet etching, dry etching, KrF laser treatments, and/or other suitable macro-roughening processes.

In an embodiment, the treated surface 112 includes an amorphous region of the GaN layer 110. The amorphous region may be formed by performing an ion implantation process on the GaN layer 110. The treated surface 112 may include an amorphous regions which extends to an interface with a crystal structure of the GaN layer 110. The treated surface 112 may be referred to as a boundary layer. In an embodiment, the boundary layer includes the amorphous region having an interface with the crystal structure GaN layer. The boundary layer may include ions such as As, Si, P, $BF_2$, Ge, C, B, F, N, Sb, Xe, and/or combinations thereof. The boundary layer (e.g., treated surface 112) may include ions that are not present in the underlying GaN layer 110. The ions included in the boundary layer (e.g., treated surface 112) provided by the implantation causing micro-roughing, may not effect the electrical performance of the GaN layer.

Referring now to FIG. 2, illustrated is an LED element 200. The LED element 200 also includes a treated surface 202. The treated surface 202 is roughened (or textured) using one or more treatments such as described below with reference to step 304 of the method 300 illustrated in FIG. 3. In an embodiment, the treated surface 202 is formed by performing an ion implantation process on a native surface of a semiconductor layer 204. The treated surface 202 having greater roughness than a native surface may provide for improved radiation (e.g., light) output by the LED element 200 as compared to an LED element with a planar surface. The treatment or surface texturing techniques provided enhance the radiation (e.g., light) extraction efficiency of the LED element 200 due to the scattering of photons from the treated surface 202.

The treated surface 202, as illustrated, includes a micro-roughened texture. In other embodiment, the ion implantation process is coupled with additional treatments such as wet etching, dry etching, KrF laser treatments, and/or other suitable macro-roughening processes. These embodiments may provide a micro-roughened and macro-roughened surface.

In an embodiment, the treated surface 202 includes an amorphous region of the associated semiconductor layer 204. In an embodiment, the semiconductor layer 204 is GaN. In a further embodiment, the semiconductor layer 204 is n-GaN. The amorphous region may be formed by the ion implantation of the layer 204. The treated surface 202 may extend to an interface with a region having crystal structure in the layer 204. The treated surface 202 may be referred to as a boundary layer. In an embodiment, the boundary layer includes the amorphous region having an interface with the crystal structure GaN layer. The boundary layer may include ions such as As, Si, P, $BF_2$, Ge, C, B, F, N, Sb, Xe, and/or combinations thereof. The boundary layer (e.g., treated surface 202) may include ions that are not present in the underlying layer 204. The ions included in the boundary layer (e.g., treated surface 202) provided by the implantation causing micro-roughing, may not effect the electrical performance of the layer 204.

The LED element 200 further includes an n-electrode 206, an active region 208, a semiconductor layer 210, a p-electrode conductive layer 212 and a substrate 214. The substrate 214 further includes a silicon sub-mount 216, a conductive bonding layer 218 and an electrode 220. In an embodiment, the semiconductor layer 210 is GaN (e.g., p-GaN). In an embodiment, the active region 208 is InGaN. In an embodiment, the semiconductor layer 204 is GaN (e.g., n-GaN). The LED element 200 is representative only and not intended to be limiting to the LED structure applicable to the present teachings. The LED element 200 may be a completed LED product, or portion thereof, or provided during one or more stages of fabrication.

Figure 3:
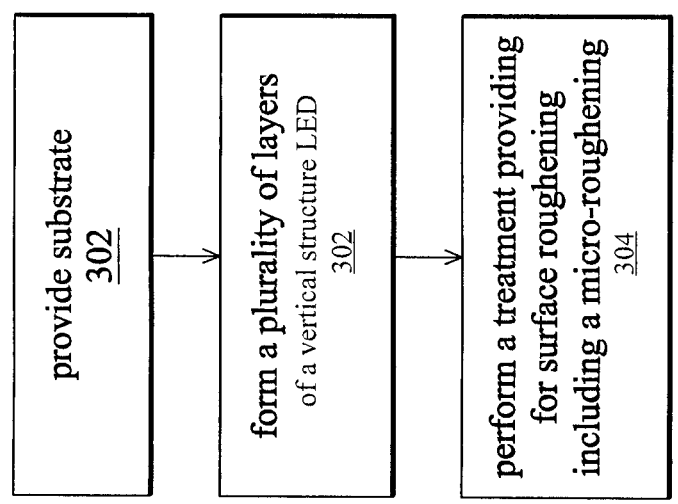
FIG. 3 is a flow chart illustrating an embodiment of a method of fabricating an LED according to aspects of the present disclosure.

Referring now to FIG. 3, illustrated is a method 300 of fabricating an LED element. The method 300 may be used to fabricate the LED element 100, the LED element 200, and/or other LED elements. FIGS. 4-8 are cross-sectional views of an LED element or portion thereof fabricated according to the method 300 of FIG. 3.

The method 300 begins at step 302 where a plurality of layers forming a vertical structure LED are formed. Referring to the example of FIG. 4, a substrate 402 is provided. In an embodiment, the substrate 402 includes sapphire. Other example compositions include silicon, SiC, GaAs, ZnO, GaAs, $MgAl_2O_4$, and/or other suitable materials now known or later developed. The substrate 402 may be referred to as a growth substrate disposed on the LED element during fabrication and subsequently removed. With continuing reference to the example of FIG. 4, a plurality of semiconductor layers are disposed on the substrate 402. In the illustrated embodiment, a first semiconductor layer 404, an A1GaN layer 406, a multiple quantum well (MQW) element 408, and a GaN layer 410 are formed on the substrate 402. In an embodiment, the semiconductor layer 404 includes GaN. The semiconductor layer 404 and/or the A1GaN 406 may be a p-type layer (e.g., p-GaN, p-AlGaN). The GaN layer 410 may be an n-type layer or layer having an n-type conductivity (e.g., n-GaN). An exemplary thickness of the semiconductor layer 404 (e.g., GaN), by way of example only and not intending to be limiting, is approximately 50 nm. An exemplary thickness of the A1GaN layer 406, by way of example only and not intending to be limiting, is approximately 20 nm. An exemplary thickness of the GaN layer 410, again by way of example only, is approximately 2 μm. Numerous other embodiments are possible including various compositions, thicknesses, and LED structures. In an embodiment, various layers are formed on the substrate 402 and a top layer remains a GaN layer (e.g., an n-GaN layer).

A top surface 412 of the semiconductor layer 410 is referred to herein as a native surface (e.g., as formed). It is noted that the top surface 412 is substantially planar or flat. In an embodiment, the top surface 412 results from an epitaxial growth of the layer 410.

In an embodiment, the vertical structure LED 400 may be formed using a conductive substrate, such as, for example, SiC for growing semiconductor layer (e.g., GaN layer 404 and 410). In an alternative embodiment, the vertical structure LED 400 is formed using a process of providing a growth substrate, and separating and/or removing this substrate (e.g., sapphire) and subsequently bonding a conductive substrate and. For example, in the illustrated embodiment, the layers 404, 406, 408, and 410 may be formed on a sapphire substrate 402. A conductive substrate may be subsequently bonded to one or more of the GaN semiconductor layers. The sapphire substrate 402 may then be removed by laser lift off and/or chemical mechanical polishing processes. In an embodiment, after separating the sapphire substrate 402 one or more electrodes are formed on the LED 400. Exemplary electrodes include n-type and/or p-type electrodes such as, electrode 114 and/or 206 illustrated above in FIGS. 1 and 2, respectively.

The treatment process described with reference to block 304 may be performed before and/or after the removal of the growth substrate (e.g., substrate 402). In an embodiment, the growth substrate is removed from a GaN semiconductor layer, which is then treated according to one or more aspects of block 304. In an embodiment, two treatments are performed one on a first conductivity side GaN semiconductor layer prior to removal of the substrate; and one on a second conductivity side GaN semiconductor layer after removal of the substrate. The first and/or second conductivity may be n-type or p-type.

Figure 5:
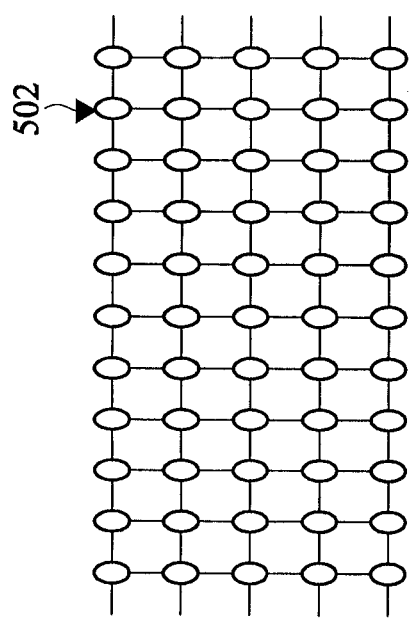

Referring now to FIG. 5, illustrated is a lattice pattern 502. The lattice pattern 502 may be the crystal pattern disposed at and near the surface of the semiconductor layer 410 (e.g., the native surface 412). The lattice pattern 502 illustrates a crystalline structure. In an embodiment, the lattice pattern 502 is crystalline n-GaN. In an embodiment, the lattice pattern 502 illustrates the crystalline structure of the layer 410 as formed during an epitaxial process.

Referring again to FIG. 3, the method 300 then proceeds to step 304 where a treatment is performed, which provides for a surface roughening or texturing. The treatment includes a micro-roughening process. In embodiments, the treatment also includes a macro-roughening process. The step 304 may provide a surface substantially similar to as described above with reference to the surface 112 of FIG. 1 and/or the surface 202 of FIG. 2.

The treatment of step 304 includes an ion implantation process. The ion implantation provides a micro-roughening (or texturing) of a surface of an exposed layer, such as the layer(s) described above with reference to step 302. Micro-roughening or texturing of a surface includes surface roughening on a nanometer scale. In other words, the roughening provided includes peak to valley differences on a nanometer scale (e.g., 500 nanometers or less). In contrast, macro-roughening or texturing of a surface, described in further detail below such as provided by a wet etch/clean, includes roughening of a surface an approximately 0.5 μm to approximately 1 μm scale. In other words, the roughening provided includes peak to valley differences of greater than approximately 0.5 μm.

Figure 6:
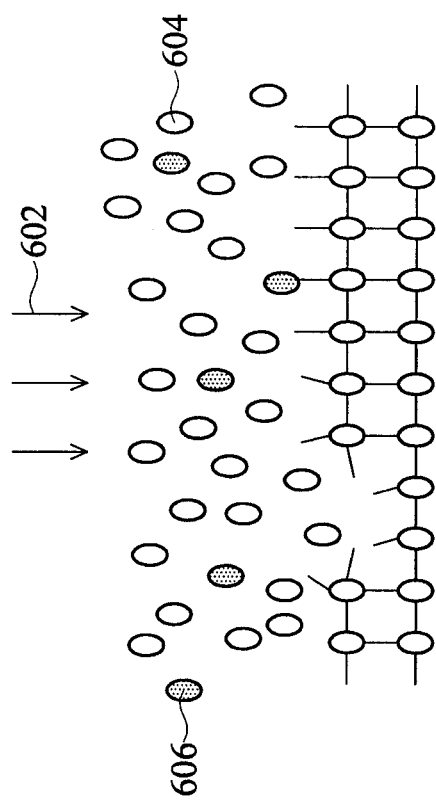

FIG. 6 illustrates an ion implantation treatment 602 performed on the lattice pattern 502, as illustrated in FIG. 5. The implantation treatment 602 includes bombarding the lattice pattern 502 (e.g., the surface of an LED element) with one or more ions denoted as 604 and 606. The ion implantation treatment 602 may modify the lattice pattern 502 or portion thereof (which was previously crystalline) to be amorphous material. The ion implantation treatment 502 may be performed at room temperature or a sub-zero degree Celsius temperature, as described in further detail below. The depth of the treatment 602 (e.g., depth of ion implantation) may be temperature and/or implantation energy dependent.

Referring to the example of FIG. 7, the surface of the semiconductor layer 410 is treated with the ion implantation process of step 304. The surface of the treated layer 410 is illustrated as treated surface 702. The treated surface 702 has an increased roughness as compared to a native surface 412 of the GaN layer 410 (as illustrated in FIG. 4). The increased roughness of the treated surface 702 may be on the micro-scale (e.g., nanometer scale) and thus, referred to herein as micro-roughening. The treated surface 702 includes a peak to valley difference of approximately T. In an embodiment, T is less than approximately 500 nm. In an embodiment, T is between approximately 10 nm and 500 nm. In an embodiment, T is less than approximately 100 nm. The treated surface 702 includes an amorphous layer of material (e.g., boundary layer) formed on the crystalline semiconductor layer of semiconductor layer 410.

The ion implantation process may be performed using a substrate temperature between approximately room temperature (e.g., approximately 25 C.) and approximately −100 C. In an embodiment, the ion implantation process is performed at less than 25 C. In an embodiment, the ion implantation is performed at less than 0 C. The temperature may be based on the substrate temperature and/or a chuck temperature upon which the substrate is disposed for the ion implantation process. Exemplary implant energy is between approximately 1 keV and approximately 3 MeV, by way of example. Exemplary implant dosage is between approximately 1.0E10 and approximately 1.0E16, by way of example. Exemplary implant species (e.g., ions to be implanted) include As, Si, P, $BF_2$, Ge, C, B, F, N, Sb, Xe, and combinations thereof.

The ion implantation treatment may be performed by implantation equipment such as, for example, high current implanters, medium current implanters, and/or high energy implanters. Example ion implantation systems include those provided by Advance Ion Beam Technology (AIBT) of Fremont, Calif. (including AIBT's "iPulsar" system); Varian Semiconductor Equipment Associates of Massachusetts (including Varian's Trident™, 900XP, or 3000XP systems); and Axcelis Technologies of Massachusetts (including Axcelis' HE3 or Optima XE system).

In an embodiment of the method 300, the step 304 includes a macro-roughening treatment prior to the micro-roughening ion implantation treatment described above. In an embodiment, the macro-roughening treatment is a wet etch or wet clean. Exemplary wet etch and clean treatments include KOH solutions. Other exemplary macro-roughening treatments include dry etch processes, laser processes such as the use of KrF laser, nano-imprint lithography, nano-particle-array, pattern sapphire substrate, chemical mechanical polish (CMP) processes, and/or other suitable processes. In embodiments, a plurality of macro-roughening processes may be performed during step 304. The macro-roughening process(es) may be performed prior to the ion implantation treatment (a micro-roughening process).

The treatment of step 304 may be performed on a plurality of layers of an LED element. For example, in the embodiment illustrated in FIGS. 7 and 8, a treatment is performed on a n-type GaN layer opposing the substrate 402. In an embodiment, the substrate 402 is removed and a treatment described in step 304 is performed on the layer 404 (e.g., a treatment is performed on a p-type GaN layer). Various other embodiments are possible and within the scope of the present disclosure. For example, any layer of an LED element, such as a GaN layer (p-type and/or n-type) may benefit from the treatment of step 304. The treatment may be performed prior to the removal of a growth substrate, after the removal of a growth substrate, prior to the attachment (bonding) of a package substrate (e.g., carrier substrate), and/or after the attachment (bonding) of a package substrate.

Referring now to FIG. 8, illustrated is an LED 800 that includes a treated surface 802 of the semiconductor layer 410. The treated surface 802 may also be referred to as a boundary layer. The treated surface 802 illustrates a macro-roughening and micro-roughening affect of treating the semiconductor layer 410. The macro-roughening affect is illustrated by the wave-like texture to the surface 802. It is noted that the present illustrations are not to scale but emphasized for ease of understanding. The macro-roughening provides a peak to valley difference of approximately T2 microns. In an embodiment, T2 is between approximately 0.5 μm and 2 μm. The treated surface 802 also includes a micro-roughening including a peak to valley difference of approximately T nanometers.

It is noted that the LEDs 700 and/or 800 may be a vertical structure LED elements during the fabrication process and additional process step(s) may occur following the formation of treated surface 702 and 802 respectively. For example, the substrate 402 may be removed, an additional substrate may be attached (bonded) to the element, one or more additional layers may be treated (e.g., layer 404) according to one or more aspects of the present disclosure.

In an embodiment of the method 300, the temperature of the ion implantation process may be controlled to provide a desired roughness (e.g., light efficiency) or surface texture. For example, a roughness (relative or absolute) may be determined based on a design goal for the light efficiency of the resultant LED and the temperature of the substrate and/or chuck during the ion implantation process may be selected based on the desired roughness. The desired temperature may be determined from experimental data and/or developed models. The surface roughness dependency on temperature is described below with reference to FIG. 9.

Figure 9:
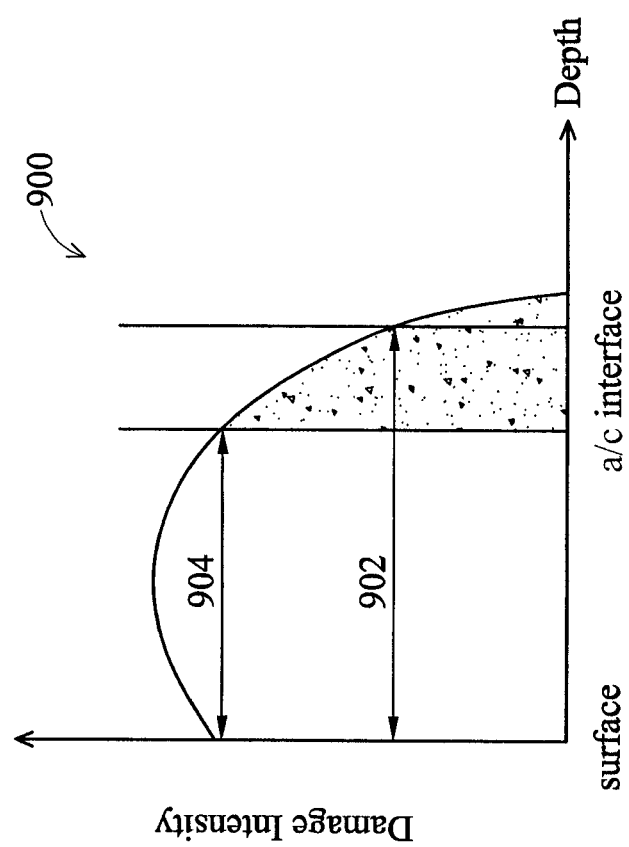
FIG. 9 is a graphical representation of an embodiment of the depth of the amorphous/crystal interface at a plurality of implantation conditions.

Referring now to FIG. 9, illustrated is a graph 900 which illustrates the intensity of the implantation (y-axis) verses the depth of the implantation affects (x-axis). The intensity of the implantation may be referred to as the damage intensity and may be measured from the concentration of dopants (in dopants/cm³) provided in the bombarded layer (for example, the semiconductor layer 410 described above with reference to FIG. 4). The depth of the implantation affects may be measured in nanometers (e.g., micro-roughening). It is noted that a low-temperature ion implantation 902 provides a greater depth of amorphous material on the surface of a treated layer than that of a room temperature ion implantation 904. In other words, the lower-temperature ion implantation 902 provides a thicker layer of amorphous material than that of the room temperature ion implantation 904. Thus, the low temperature ion implantation 902 may provide for a greater surface roughening than the room temperature ion implantation 904. Therefore, the low temperature ion implantation 902 may provide for a greater radiation output or efficiency than the room temperature ion implantation 904.

In summary, the methods and devices disclosed herein describe LED elements and method of fabrication thereof. In doing so, the present disclosure offers embodiments that provide several advantages over prior art devices. Advantages of embodiments of the present disclosure include an improved roughness of a surface of an LED element, enhanced radiation (e.g., light) output by the element, increased LED efficiency, and/or other advantages. It is understood that different embodiments disclosed herein offer different disclosure, and that they may make various changes, substitutions and alterations herein without departing from the spirit and scope of the present disclosure. For example, the embodiments disclosed herein may be applied to various LED types and structures.

Thus, described is an embodiment of a method, which includes providing an LED element including a gallium nitride (GaN) layer disposed on a substrate. The substrate may be a handling or growth substrate, which may be subsequently removed, or a package (e.g., carrier) substrate, which may be disposed in the product LED. The GaN layer is treated. The treatment includes performing an ion implantation process on the GaN layer. In an embodiment, the substrate is at a temperature less than approximately zero degrees Celsius during the ion implantation process. In an embodiment, the ion implantation process is performed at a temperature of less than approximately 25 degrees Celsius.

In a further embodiment, the treatment further includes performing a wet etch such an etch using KOH. The ion implantation treatment may provide a micro-roughening of a surface of the GaN layer.

An exemplary the ion implantation process includes implanting a species from the group consisting of As, Si, P, $BF_2$, Ge, C, B, F, N, Sb, Xe, and combinations thereof.

In another embodiment, a method is described that includes providing an LED element including a substrate and a semiconductor layer disposed on the substrate. The semiconductor layer has an exposed top surface. An ion implantation process is performed on the exposed top surface. The ion implantation process is performed while having the substrate at less than approximately zero degrees Celsius. In a further embodiment, the substrate is between approximately zero degrees and −100 degrees Celsius.

In embodiments, the method further includes performing a macro-roughening process prior to performing the ion implantation process. Exemplary macro-roughening processes include a wet etch, a dry etch, and a laser treatment (KrF).

In an embodiment, the semiconductor layer described above is GaN. In a further embodiment, the semiconductor layer is GaN having an n-type conductivity (n-GaN).

Also described is a light emitting diode (LED) element or device. The LED element includes a substrate and a GaN layer formed on the substrate. The GaN layer includes a treated surface having a micro-roughening texture. In an embodiment, the micro-roughening texture includes an amorphous region. In a further embodiment, the treated surface also has a macro-roughening texture. The treated surface may be formed by ion implantation of the GaN layer.

What is claimed is:

1. A device, comprising:
a substrate; and
a doped III-V compound layer disposed over the substrate;
wherein:
the doped III-V compound layer includes an upper boundary;
the upper boundary has a micro-roughened texture and a macro-roughened texture where the micro-roughened texture located on; and
the upper boundary includes dopant ions that are not present in a remainder of the doped III-V compound layer underneath the upper boundary.

2. The device of claim 1, wherein the dopant ions include at least one of: As, Si, P, Ge, C, B, F, N, Sb, and Xe ions.

3. The device of claim 1, wherein the substrate is a sapphire substrate.

4. The device of claim 1, wherein the doped III-V compound layer is a gallium nitride (GaN) layer.

5. The device of claim 1, wherein the doped III-V compound layer is a part of a light-emitting diode (LED).

6. The device of claim 1, wherein the micro-roughened texture includes an amorphous region.

7. The device of claim 1, wherein the upper boundary includes a different dopant profile than a remainder of the doped III-V compound layer.

8. The device of claim 1, wherein the micro-roughened texture has peak to valley differences less than about 500 nanometers.

9. The device of claim 8, wherein the macro-roughened texture has peak to valley differences from about 0.5 microns to about 1 micron.

10. A device, comprising:
a substrate; and
a light-emitting diode (LED) disposed over the substrate, the LED containing a first doped III-V compound layer, a multiple quantum well (MQW) disposed over the first doped III-V compound layer, and a second doped III-V compound layer disposed over the MQW,
wherein:
the second doped III-V compound layer has a treated upper surface;
the treated upper surface has a micro-roughened texture including first peak to valley differences and a macro-roughened texture including second peak to valley differences, and the micro-roughened texture is located on the macro-roughened texture; and
a portion of the second doped III-V compound layer located near the upper surface contains dopant ions that include at least one of: As, Si, P, Ge, C, B, F, N, Sb, and Xe ions.

11. The device of claim 10, wherein the substrate is a sapphire substrate.

12. The device of claim 10, wherein the first and second doped III-V compound layers contain p-type doped gallium nitride (GaN) and n-type doped GaN, respectively.

13. The device of claim 10, wherein the micro-roughened texture includes an amorphous region.

14. The device of claim 10, a rest of the second doped III-V compound layer does not contain the dopant ions in the portion of the second doped III-V compound layer located near the upper surface.

15. The device of claim 10, wherein:
the first peak to valley differences are less than about 100 nanometers; and
the second peak to valley differences are between about 0.5 microns to about 1 micron.

16. A device, comprising:
a substrate;
a GaN layer formed on the substrate, wherein the GaN layer includes a boundary layer including a surface of the GaN opposing the substrate, wherein the surface has a micro-roughening texture and a macro-roughening texture where the micro-roughening tecture located on, and wherein the boundary layer includes at least one of As, Si, P, Ge, C, B, F, N, Sb, and Xe ions.

17. The device of claim 16, wherein the micro-roughening texture includes an amorphous region.

18. The device of claim 16, wherein the boundary layer is formed by ion implantation of the GaN layer, and wherein the boundary layer includes a different dopant profile than a remainder of the GaN layer.

19. The device of claim 16, wherein the GaN layer is a part of a light-emitting diode (LED).

20. The device of claim 16, wherein the micro-roughening texture has peak to valley differences on a nanometer scale, and wherein the macro-roughening texture has peak to valley differences on a micrometer scale.

* * * * *